United States Patent
Hetzler

(10) Patent No.: US 8,884,733 B2
(45) Date of Patent: Nov. 11, 2014

(54) CURRENT-SENSE RESISTOR

(75) Inventor: Ullrich Hetzler, Dillenburg-Oberscheld (DE)

(73) Assignee: Isabellenhuette Heusler GmbH & Co. KG, Dillenburg (DE)

( * ) Notice: Subject to any disclaimer, the term of this patent is extended or adjusted under 35 U.S.C. 154(b) by 1 day.

(21) Appl. No.: 13/819,020

(22) PCT Filed: Aug. 24, 2011

(86) PCT No.: PCT/EP2011/004245
§ 371 (c)(1),
(2), (4) Date: Mar. 28, 2013

(87) PCT Pub. No.: WO2012/019784
PCT Pub. Date: Feb. 16, 2012

(65) Prior Publication Data
US 2013/0181807 A1    Jul. 18, 2013

(30) Foreign Application Priority Data
Aug. 26, 2010 (DE) .......................... 10 2010 035 485

(51) Int. Cl.
*H01C 7/06* (2006.01)
*G01R 1/20* (2006.01)
*H01C 7/00* (2006.01)

(52) U.S. Cl.
CPC *H01C 7/06* (2013.01); *G01R 1/203* (2013.01); *H01C 7/001* (2013.01)
USPC ................ 338/7; 338/195; 338/332; 338/333

(58) Field of Classification Search
USPC .................... 338/7, 25, 195, 333, 334, 322
See application file for complete search history.

(56) References Cited
U.S. PATENT DOCUMENTS
5,999,085 A    12/1999  Szwarc et al.

RE39,660 E *    5/2007  Szwarc et al. ................ 338/309
(Continued)

FOREIGN PATENT DOCUMENTS
DE        2939594 A1    4/1981
DE   102009031408 A1    1/2011
(Continued)

OTHER PUBLICATIONS
International Search Report for PCT/EP2011/004245 dated Jan. 6, 2012.
(Continued)

*Primary Examiner* — Kyung Lee
(74) *Attorney, Agent, or Firm* — Caesar, Rivise, Bernstein, Cohen & Pokotilow, Ltd.

(57) ABSTRACT

The invention relates to a current-sensing resistor (1) for measuring an electric current, in particular also for measuring a battery current in a vehicle power supply, having a plate-shaped first connecting part (3) for introducing the electrical current to be measured, wherein the plate-shaped first connecting part (3) consists of an electrically conductive conductor material; a plate-shaped second connecting part (2) for conducting away the electrical current to be measured, wherein the plate-shaped second connecting part (2) consists of an electrically conductive conductor material; and a plate-shaped resistance element (4), which is connected in the current path between the two connecting parts and through which the electrical current to be measured flows, wherein the resistance element (4) consists of a comparatively high-impedance resistance material. According to the invention an incision (10, 11) is arranged in the plate-shaped first connecting part (3) and/or in the plate-shaped second connecting part (2) in order to reduce the temperature dependency of the measurement and to eliminate the influence of the plate-shaped connecting parts (usually copper or aluminum).

9 Claims, 4 Drawing Sheets

(56) References Cited

U.S. PATENT DOCUMENTS

| | | | |
|---|---|---|---|
| 7,911,319 B2 * | 3/2011 | Smith et al. | 338/332 |
| 8,198,977 B2 * | 6/2012 | Smith et al. | 338/25 |
| 8,531,264 B2 * | 9/2013 | Li et al. | 338/333 |
| 2004/0216303 A1 * | 11/2004 | Berlin et al. | 29/610.1 |
| 2009/0195348 A1 | 8/2009 | Smith et al. | |
| 2012/0154104 A1 | 6/2012 | Hetzler | |

FOREIGN PATENT DOCUMENTS

| | | |
|---|---|---|
| EP | 0605800 A1 | 7/1994 |
| JP | 2002289412 A | 10/2002 |
| JP | 2003232814 A | 8/2003 |
| JP | 2002519672 A5 | 7/2006 |
| JP | 2013504213 A | 2/2013 |
| WO | 0000833 A1 | 1/2000 |
| WO | 2011028870 A1 | 3/2011 |

OTHER PUBLICATIONS

Patent Abstracts of Japan for 2002-289412.

Patent Abstracts of Japan for 2003-232814.

* cited by examiner

----- Current lines
-·-·- Equipotential lines

CURRENT-SENSE RESISTOR

BACKGROUND OF THE INVENTION

The invention concerns a current-sense resistor for measuring an electrical current, especially for measuring a battery current in a motor vehicle on-board electrical system.

EP 0 605 800 A1 discloses a current-sense resistor of this type, which consists of two copper plate-shaped connecting parts and an also plate-shaped low-ohm resistance element made of a resistance alloy (e.g. Cu84Ni4Mn12), wherein the resistance element is placed between the connecting parts and welded to the connecting parts. Such current-sense resistors are used to measure the electrical current as per the well-known four-wire technology, wherein the current to be measured is conducted through the resistance element via the plate-shaped connecting parts. The voltage drop over the resistance element then forms a measure for the electrical current to be measured in accordance with Ohm's law. The known current-sense resistor consequently has two voltage contacts on both plate-shaped connecting parts with the voltage contacts arranged near the resistance element and thus allowing a measurement of the voltage drop over the resistance element. Such current-sense resistors exhibit only a relatively low temperature dependency of the measurement, since, usually, the resistance material used (e.g. Cu84Ni4Mn12) has a very low temperature coefficient. However, the demands on temperature constancy of such current-sense resistors are still increasing.

U.S. Pat. No. 5,999,085 discloses a low-ohm current-sense resistor which has an incision on each connecting part which divides the connecting parts into a voltage contact and a current contact each. Both current contacts are used for introducing the current to be measured into or conducting it away from the current-sense resistor. Both voltage contacts serve, in contrast, to measure the electric voltage that decreases over the current-sense resistor according to the well-known four-wire technology. Here, the incision in the connecting parts runs parallel to the current flow direction between both connecting parts and therefore does not have a particularly favorable effect on the temperature stability of the current measurement. Here, the incisions in particular have a very limited influence on the current course in the connecting parts since they are oriented parallel to the main current direction.

Therefore, the object of the invention is to improve the temperature constancy of the above-described conventional current-sense resistor.

This object is achieved by a current-sense resistor according to the invention.

DESCRIPTION OF THE INVENTION

The invention is based on the technical-physical finding that the conductor material (e.g. copper) of the plate-shaped connecting parts has a much higher temperature coefficient than the resistance material (e.g. Cu84Ni4Mn12) of the plate-shaped resistance element. During the measuring of the electrical current that drops over the resistance element between both voltage contacts, there is, however, also an influence on the measurement caused by the material of the connecting parts. The temperature dependency of the voltage measurement thus is not only determined by the temperature coefficient of the resistance material, but also by the temperature coefficient of the conductor material. Here, it is important to take into consideration that the temperature coefficient of copper, for example, is $\alpha=83.9 \cdot 10^{-3} \text{ K}^{-1}$ and thus greater by a factor of 195 than the temperature coefficient of Cu84Ni4Mn12 (Manganin®) with $\alpha=0.02 \cdot 10^{-3} \text{ K}^{-1}$. Due to the much greater temperature coefficient of copper, the plate-shaped connecting parts actually influence the temperature dependency of the entire measurement if only a small part of the voltage between the voltage contacts drops over the connecting parts.

The invention therefore comprises the general technical teaching of providing an incision in at least one of the plate-shaped connecting parts to reduce the temperature dependency of the measurement.

The incision preferably runs at least partially transversely (e.g. at a right angle) with respect to the current flow direction between both connecting parts. The incision is therefore oriented at least partially transversely (e.g. at a right angle) to the connecting line between both connecting parts. In other words, the incision preferably runs parallel to the connecting line between the resistance element and the neighboring connecting parts for at least a portion of its length. The current-sense resistor according to the invention thus differs from the known current-sense resistor according to U.S. Pat. No. 5,999,085 as described at the beginning which has an incision oriented parallel to the current flow direction.

In a preferred exemplary embodiments, the current-sense resistor according to the invention corresponds to a great extent to the current-sense resistor described in EP 0 605 800 A1, so that the content of this patent application is to be incorporated in full in the present description as regards the design of the current-sense resistor. It should merely be mentioned at this point that the current-sense resistor according to the invention has two plate-shaped connecting parts that consist of an electrically conductive conductor material (e.g. copper) and are used for introducing or conducting away the electrical current to be measured. In addition, the current-sense resistor according to the invention has a plate-shaped resistance element connected in the current path between both connecting parts and through which the electric current to be measured flows, wherein the resistance element consists of a low-ohm resistance material (e.g. Cu84Ni4Mn12) which is low-ohm from an absolute point of view, but has a greater specific resistance than the conductor material.

The current-sense resistor according to the invention preferably has two voltage contacts to measure the electrical current dropping over the resistance element as a measure for the electrical current to be measured as per Ohm's law, which voltage contacts are connected electrically and mechanically with both plate-shaped connecting parts, wherein both voltage contacts are preferably arranged as close as possible to the resistance element on the plate-shaped connecting parts.

For example, the voltage contacts can be an embossment as described e.g. in DE 10 2009 031 40, so that the content of this patent application is to be incorporated in full in the present description as regards the constructional design of the voltage contacts.

Alternatively, there is the option of designing the voltage contacts as contact surfaces, as described, for example, in EP 0 605 800 A1, so that the content of this patent application is to be incorporated in full in the present description as regards the constructional design of the voltage contacts.

In addition, in the framework of the invention, there are also different other options for the constructional design of the voltage contacts.

With such design of the current-sense resistor according to the invention with two voltage contacts, there is a preference for at least one incision in each of both associated plate-shaped connecting parts in order to reduce temperature dependency of the measurement.

Here, both incisions in both plate-shaped connecting parts are preferably arranged in such a way as to transform the current lines and the equipotential lines in the plate-shaped connecting parts in such a way that the equipotential lines in the plate-shaped connecting parts running through the voltage contacts directly reach the contact point (joining point) with the resistance element, i.e. usually the weld seam between the plate-shaped connecting parts and the resistance element. The advantage of this is that the voltage contacts are then at the same electrical potential as the edges of the resistance element, so that the voltage measurement is not in the least distorted by the conductor material of the plate-shaped connecting parts.

Both incisions in both plate-shaped connecting parts are therefore preferably arranged on the side of the respective voltage contact that is facing away from the resistance element. Thus, both incisions preferably run between the voltage contacts and the respective current contacts, which serve for introducing or conducting away the electrical current to be measured and which are electrically and mechanically connected to the respective plate-shaped connecting part.

There are also several options in the context of the invention as regards the constructional design of the current contacts, some examples of which are described in EP 0 605 800 A1 and DE 10 2009 031 408, so that the content of this patent application is to be incorporated in full in the present description as regards the constructional design of the voltage contacts.

It should also be mentioned that the incisions are preferably arched, wherein the incisions extend over an arc angle of more than 30°, 40°, 50°, 60° or even 70°.

Furthermore it should be mentioned that the incisions in the plate-shaped connecting parts in the preferred exemplary embodiment are each arched or angled away from the current contacts and towards the resistance elements.

The incision preferably exhibits a width that is essentially constant over the length of the incision. The incisions are thus preferably slit-shaped, although other shapes are also possible.

It should furthermore be mentioned that the incision preferably extends from an edge of the respective connecting part towards the inside, wherein the incisions in both connecting parts preferably extend from the same edge.

In addition, it should be noted that the incision preferably does not reach the position of the resistance element or the opposite edge of the respective plate-shaped connecting part, so that the voltage contacts can come into contact with the resistance element on its entire width over the plate-shaped connecting part despite the incision.

Through the arrangement, according to the invention, of incisions in the plate-shaped connecting parts, it is possible in the framework of the invention that the temperature coefficient of the resistance of the entire current-sense resistor is by at least 30%, 40%, 50% or 60% smaller than for a current-sense resistor with the otherwise identical construction without such an incision.

For the preferred exemplary embodiment of the invention, copper or a copper alloy is used as the conductor material for the plate-shaped connecting parts. However, with regard to the conductor material used, the invention is not limited to the aforementioned examples.

It should also be noted that the resistance material for the resistance element is preferably a copper alloy, in particular a copper-manganese-nickel alloy such as Cu84Ni4Mn12 (Manganin®). However, with regard to the resistance material used for the resistance element, the invention is not limited to the aforementioned examples. However, the resistance materials of the resistance element preferably exhibits a lower conductivity resp. a greater specific resistance than the conductor material of the plate-shaped connecting parts.

It should also be mentioned that the resistance element is preferably connected to both connecting parts electrically and mechanically, in particular through a welded connection, wherein electron beam welding is particularly suitable as already described in detail in EP 0 605 800 A1, so that the content of this patent application is to be incorporated in full in the present description as regards the design and manufacturing method of the current-sense resistor according to the invention.

Finally, it should also be mentioned that both connecting parts are preferably arranged on opposite sides of the resistance element, so that the resistance element is located between both connecting parts. There is, however, the alternative option of arranging both connecting parts on the same side of the resistance element.

BRIEF DESCRIPTION OF THE DRAWINGS

Other advantageous developments of the invention are explained in more detail below together with the description of the preferred exemplary embodiment of the invention on the basis of the figures. The figures show as follows:

FIGS. 1 to 4 and 5B show a preferred exemplary embodiment of a current-sense resistor 1 according to the invention, which may, for example, be used to measure a current according to the known four-wire technology in a motor vehicle on-board electrical system.

The current-sense resistor 1 according to the invention largely corresponds to a conventional current-sense resistor as it is described e.g. in EP 0 605 800 A1, so that additional reference is made to this patent application.

The current-sense resistor 1 according to the invention essentially consists of two plate-shaped connecting parts 2, 3 made of a conductor material (e.g. copper) and an also plate-shaped resistance element 4 made of a low-ohm resistance material (e.g. Cu84Ni4Mn12) which is inserted between both plate-shaped connecting parts 2, 3. Here, both plate-shaped connecting parts 2, 3 are arranged on opposite sides of the also plate-shaped resistance element 4 and welded to the plate-shaped resistance element 4.

Figure 1:
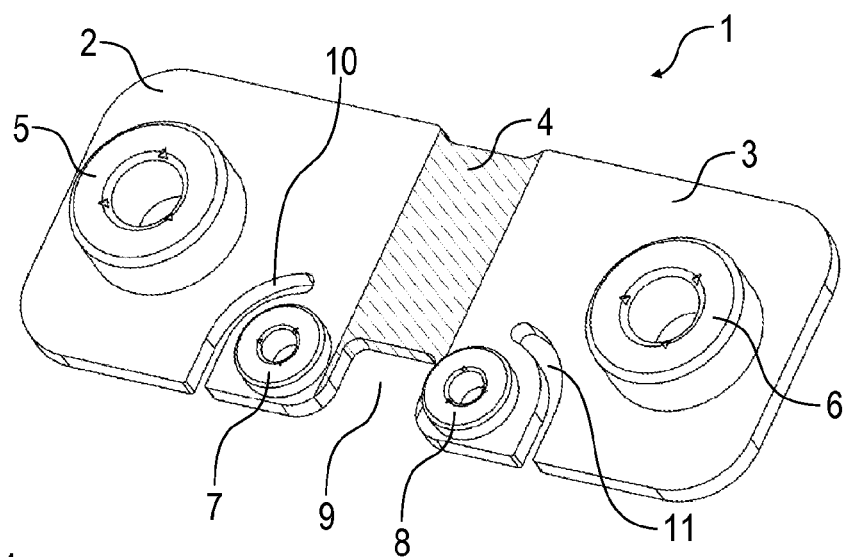
FIG. 1 a perspective view of a current-sense resistor according to the invention, FIG. 2 a plan view of the current-sense resistor from FIG. 1, FIG. 3 a side view of the current-sense resistor from FIGS. 1 and 2, FIG. 4 a detailed view of the current-sense resistor from FIG. 2, FIG. 5A a plan view of a conventional current-sense resistor with the distribution of the current lines and the equipotential lines between the voltage contacts.
Figure 2:
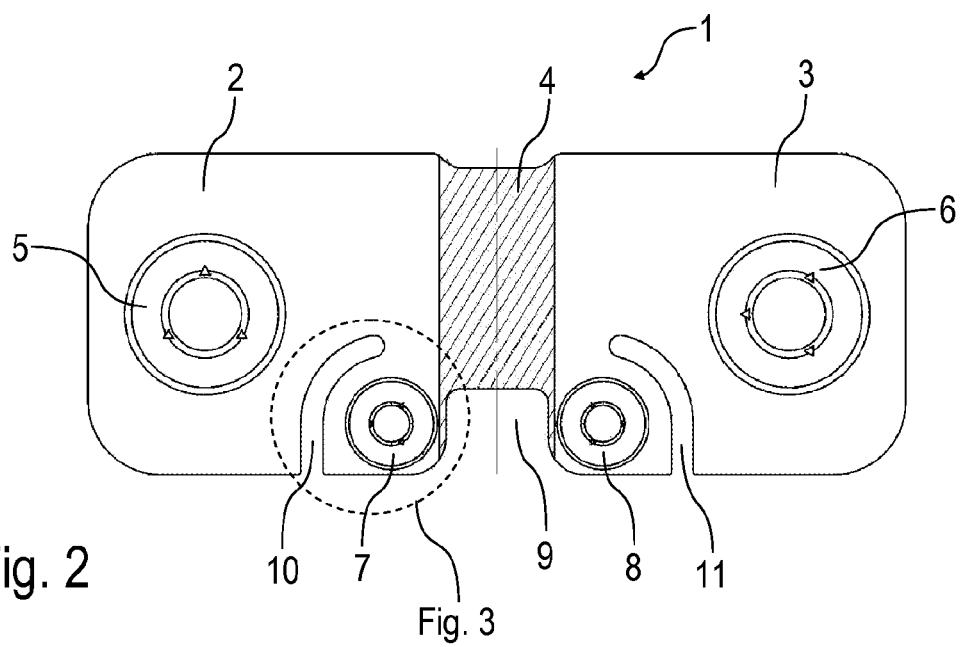
Figure 3:
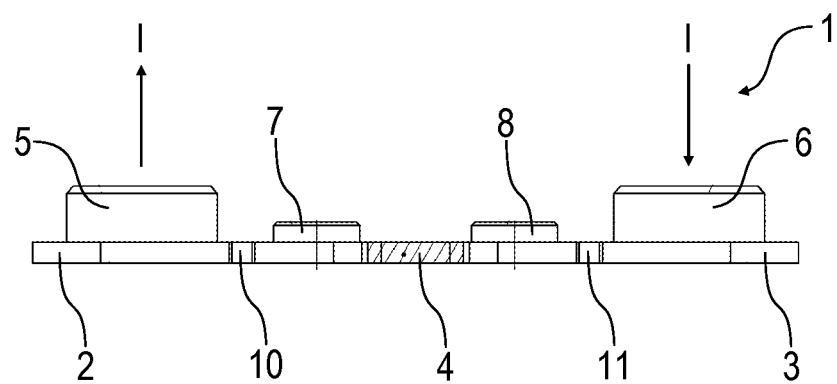

In addition, the current-sense resistor 1 according to the invention has two current contacts 5, 6 which are electrically and mechanically connected with both plate-shaped connecting parts 2, 3, wherein the current contact 6 used for introducing an electrical current I to be measured, while current contact 5 serves for conducting away the electrical current I to be measured, as is particularly clear from the side view in FIG. 3.

In addition, the current-sense resistor 1 according to the invention has two voltage contacts 7, 8 which are electrically and mechanically connected with both plate-shaped connecting parts 2, 3 and serve for measuring the electrical voltage that drops over the resistance element 4. Both voltage contacts 7, 8 are therefore arranged very close to the resistance element 4 in the plate-shaped connecting parts 2, 3 to avoid distortion of the voltage measurement by the electric voltage drop over the connecting parts 2,3.

It should be mentioned that the current-sense resistor 1 according to the invention has, on the side in the area of the resistance element 4, an incision 9 which is used for calibrating or adjusting the desired resistance value of the current-sense resistor 1 by making the incision 9 larger or smaller in the framework of manufacturing.

It is, however, import for function according to the invention that one incision 10, 11 each is arranged in both plate-shaped connecting parts 2, 3 in order to reduce the temperature dependency of the measurement. Here, both incisions 10, 11 extend transversely from the same edge of the plate-shaped connecting part 2 or 3 inwardly and are then led around the respective voltage contacts 7 or 8 in an arched manner, wherein both incisions 10, 11 extend over an arc angle $\alpha \approx 70°$, as is particularly visible in the detailed view provided in FIG. 4.

Figure 4:
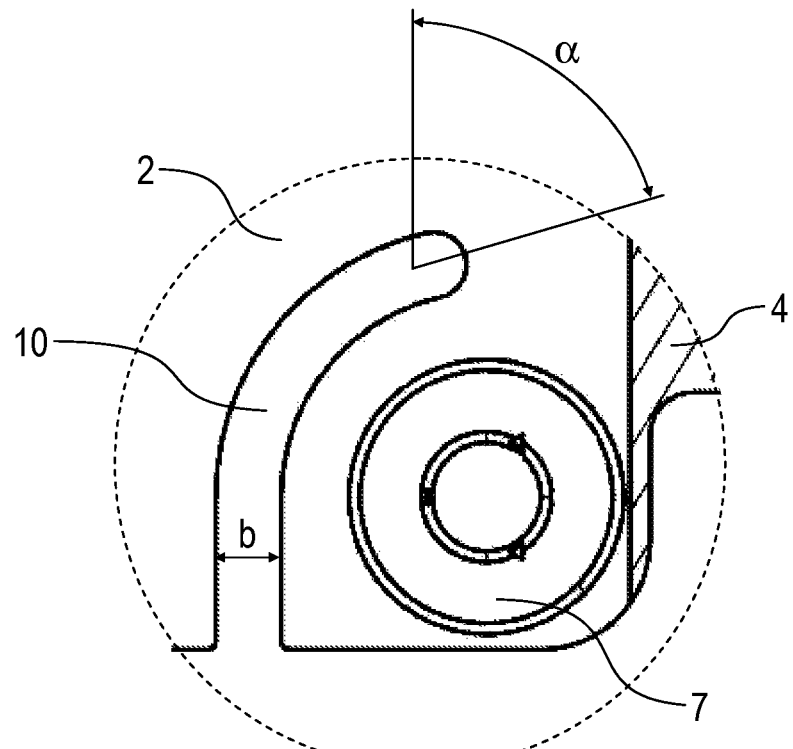

Furthermore, the detailed view in FIG. 4 shows that both incisions 10, 11 are slit-shaped and have a width b that is essentially constant over the entire length of the incisions 10, 11.

Figure 5A:
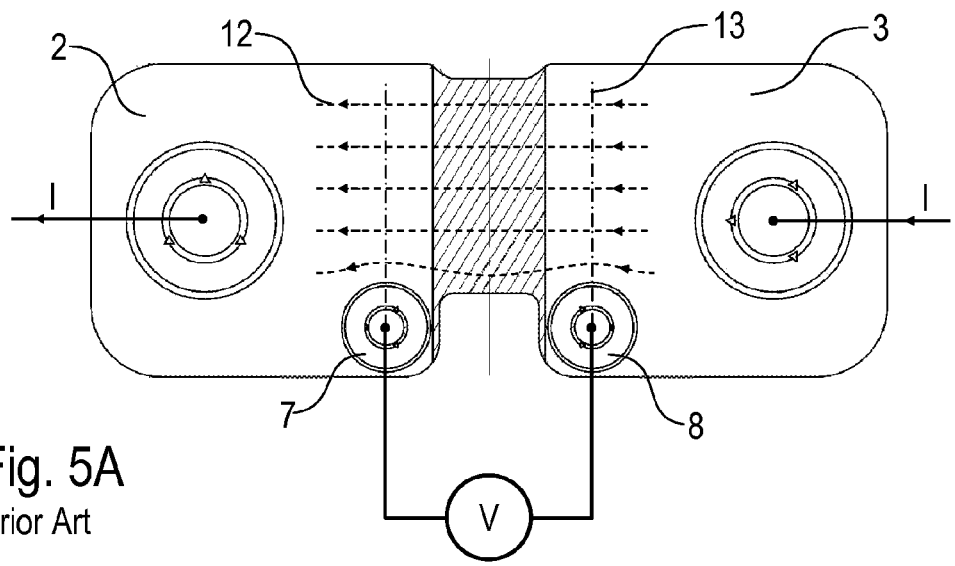
FIG. 5B for the purpose of comparison, a plan view of the current-sense resistor according to the invention, as well as FIG. 6 a diagram to show the temperature dependency of the resistance value of the current-sense resistor according to the invention compared with a conventional current-sense resistor.
Figure 5B:
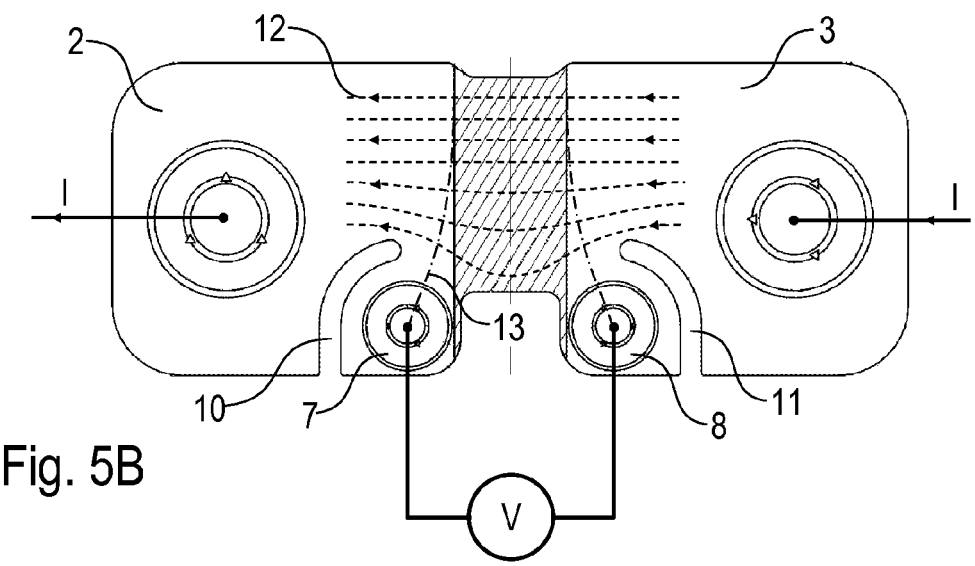

The function of both incisions 10, 11 becomes obvious when one compares both FIGS. 5A and 5B, wherein FIG. 5A shows the course of the current lines 12 and equipotential lines in a conventional current-sense resistor 1, whereas FIG. 5B shows the course of the current lines 12 and the equipotential lines 13 in the current-sense resistor according to the invention. Here, the current lines 12 define a main current direction, wherein the incisions 10, are partly oriented transverse to this main current direction in order to influence the current course.

This comparison shows that in the conventional current-sense resistance 1 according to FIG. 5A, the equipotential lines running through the voltage contacts 7, 8 are not at exactly the same electrical potential as the outer edges of the resistance element 4. This means that the voltage measured between the voltage contacts 7, 8 partly consists of the voltage that drops over the plate-shaped connecting parts 2,3. Thus, the measured voltage is also influenced by the relatively high temperature dependency of the conductor material of connecting parts 2,3.

In the current-sense resistor 1 according to the invention as per FIG. 5B, the incisions 10, 11, in contrast, deflect the current course 12 and the equipotential lines 13 away in such a manner that the equipotential lines running through the voltage contacts 7, 8 reach the outer edges of the resistance element 4 and therefore are at the same electrical potential. During voltage measurement, only the voltage that drops over the resistance element 4 is thus measured. This is advantageous because the conductor material (e.g. copper) of the plate-shaped connecting parts 2, 3 usually exhibits a much higher temperature dependency with regard to the specific electrical resistance than the resistance material (e.g. Manganin®) of the resistance element 4. Here, the equipotential lines 13 asymptotically adapt to the welding edge between the plate-shaped connecting parts 2, 3 and the resistance element 4.

Figure 6:
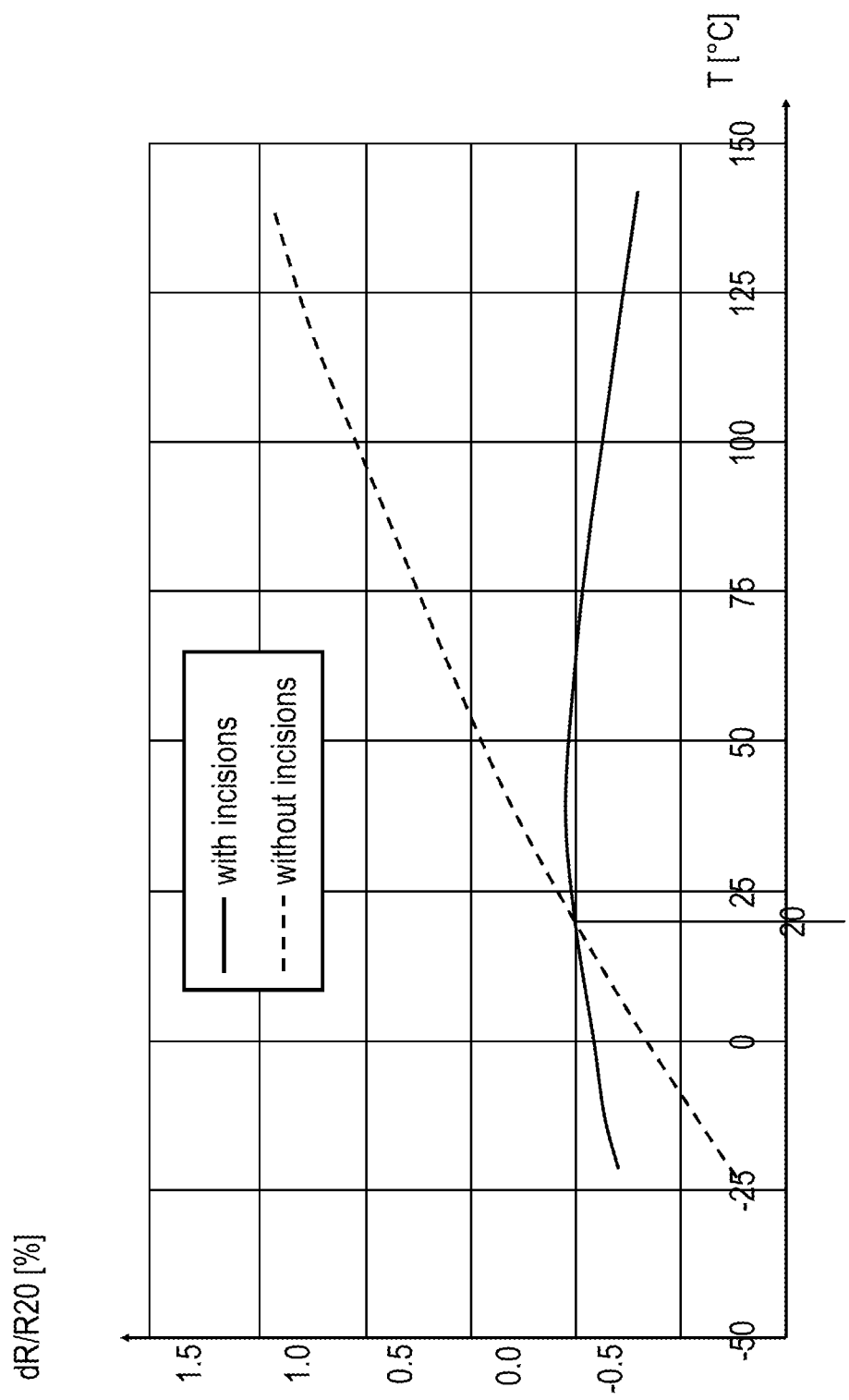

The design of the current-sense resistor 1 according to the invention with the incisions 10, 11 leads to a considerable decrease of the temperature dependency during current measurement as can be seen in the diagram in FIG. 6, which shows the temperature dependency of the resistance value R as a function of the temperature T.

The invention is not limited to the previously described preferred exemplary embodiment. Instead, a plurality of variants and modifications are possible, which also make use of the concept of the invention and thus fall within the scope of protection. Furthermore, the invention also claims protection for the subject-matter of the subclaims independently of the features of the claims to which they refer.

LIST OF REFERENCE NUMERALS

1 Current-sense resistor
2 Connecting part
3 Connecting part
4 Resistance element
5 Current contact
6 Current contact
7 voltage contact
8 voltage contact
9 Incision
10 Incision
11 Incision
12 Current lines
13 Equipotential lines

The invention claimed is:

1. A current-sense resistor adapted for measuring an electric current comprising:
    a) a plate-shaped first connecting part for introducing the electric current to be measured, wherein the plate-shaped first connecting part comprises an electrically conductive conductor material,
    b) a plate-shaped second connecting part for conducting away the electric current to be measured, wherein the plate-shaped second connecting part comprises an electrically conductive conductor material,
    c) a plate-shaped resistance element, which is connected in a current path between the first and second connecting parts and through which the electric current to be measured flows, wherein the resistance element comprises a low-ohm resistance material,
    d) wherein the electric current to be measured flows along a main current direction between the first and second connecting parts,
    e) a first voltage contact connected electrically and mechanically with the plate-shaped first connecting part,
    f) at least one first incision arranged in the plate-shaped first connecting part in order to reduce a temperature dependency of the measuring, wherein
        f1) the at least one first incision is oriented at least on a portion of a length thereof transversely with respect to the main current direction, and
        f2) the at least one first incision extends in an arched manner around the first voltage contact,
    g) a second voltage contact connected electrically and mechanically with the plate-shaped second connecting part, and h) at least one second incision arranged in the plate-shaped second connecting part in order to reduce the temperature dependency of the measuring, wherein h1) the at least one second incision is oriented at least on a portion of a length thereof transversely with respect to the main current direction, and h2) the at least one second incision extends in an ardhed manner around the second voltage contact.

2. The current-sense resistor according to claim 1, wherein in the plate-shaped first connecting part, a first equipotential line runs from the first voltage contact to a contact point with the resistance element, so that the first voltage contact lies on a same electric potential as the contact point with the resistance element, and in the plate-shaped second connecting part, a second equipotential line runs from the second voltage contact to a contact point with the resistance element, so that the second voltage contact lies on a same electric potential as the contact point with the resistance element.

3. The current-sense resistor according to claim 1, wherein the at least one first incision in the first connecting part is arranged on a side of the first voltage contact facing away from the resistance element, and the at least one second incision in the plate-shaped second connecting part is arranged on a side of the second voltage contact facing away from the resistance element.

4. The current-sense resistor according to claim 1, wherein the at least one first and second incisions are arc-bent, and b) the at least one first and second incisions extend over an arc angle of more than 30°.

5. The current-sense resistor according to claim 1, wherein a first current contact is connected electrically and mechanically with the plate-shaped first connection part, wherein the first current contact serves for introducing the electric current to be measured, and a second current contact is connected electrically and mechanically with the plate-shaped second connection part, wherein the second current contact serves for conducting away the electric current to be measured.

6. The current-sense resistor according to claim 5, wherein the at least one first and second incisions are bent away from the current contacts and towards the resistance element.

7. The current-sense resistor according to claim 1, wherein each of the at least one first and second incision has a substantially constant width over its length, and the at least one first incision originates from an edge of the first connecting part and extends inwards, the at least one second incision originates from an edge of the plate-shaped second connecting part and extends inwards, and the at least one first and second incisions do not respectively reach until the resistance element, so that the voltage contacts can contact an entire width of the resistance element via the plate-shaped first and second connecting parts.

8. The current-sense resistor according to claim 1, wherein the current-sense resistor has a defined resistance value with a defined temperature coefficient, and the temperature coefficient of the resistance value is least 30% smaller than for a current-sense resistor with an otherwise identical construction without the at least one first and second incisions in the plate-shaped connecting parts.

9. The current-sense resistor according to claim 1, wherein the conductor material is at least one of copper and a copper alloy, and the resistance material is a copper alloy, and the resistance element is connected electrically and mechanically with both connecting parts, and both connecting parts are arranged on opposite sides of the resistance element.

\* \* \* \* \*